United States Patent [19]
Fajen et al.

[11] Patent Number: 5,578,961
[45] Date of Patent: Nov. 26, 1996

[54] MMIC BIAS APPARATUS AND METHOD

[75] Inventors: Lyle A. Fajen; Michael Dydyk, both of Scottsdale; Hugh R. Malone, Phoenix, all of Ariz.

[73] Assignee: Motorola, Inc., Schaumburg, Ill.

[21] Appl. No.: 585,866

[22] Filed: Jan. 16, 1996

Related U.S. Application Data

[63] Continuation of Ser. No. 280,961, Jul. 27, 1994, abandoned.

[51] Int. Cl.$^6$ ........................................................ G05F 3/02
[52] U.S. Cl. .......................... 327/543; 327/104; 327/307; 327/331; 327/390; 327/534
[58] Field of Search .................................... 327/104, 331, 327/535, 536, 538, 390, 307, 543, 534, 537, 589

[56] References Cited

U.S. PATENT DOCUMENTS

| | | | |
|---|---|---|---|
| 3,121,803 | 2/1964 | Watters | 327/128 |
| 3,916,221 | 10/1975 | Boyer | 327/104 |
| 4,030,016 | 6/1977 | Marriot | 327/104 |
| 4,227,257 | 10/1980 | Sato | 327/531 |
| 4,433,253 | 2/1984 | Zapisek | 327/536 |
| 4,621,315 | 11/1986 | Vaughn et al. | 363/60 |
| 4,670,669 | 6/1987 | Cottrell et al. | 327/536 |
| 4,701,632 | 10/1987 | Guillaumin | 327/104 |
| 4,992,683 | 2/1991 | Robin, Jr. | 307/570 |
| 5,036,229 | 7/1991 | Tran | 327/536 |
| 5,041,739 | 8/1991 | Goto | 327/536 |
| 5,508,874 | 4/1996 | Williams et al. | 361/92 |
| 5,510,747 | 4/1996 | Williams | 327/434 |

*Primary Examiner*—Terry Cunningham
*Attorney, Agent, or Firm*—Bradley J. Botsch, Sr.

[57] ABSTRACT

A microwave monolithic integrated circuit (MMIC) RF-generated bias circuit and method includes an input for receiving an RF signal. A rectifier coupled to the input and to electrical ground produces a rectified RF signal in response. A voltage divider coupled to the rectifier and to the electrical ground receives the rectified RF signal and produces a DC voltage therefrom. An output is coupled to the voltage divider for applying the DC voltage to a MMIC field effect transistor (FET) for biasing. No separate bias battery is required, and efficiency is optimized because the generated bias voltage increases to the point where the amplifier voltage begins to decrease, which in turn reduces the generated bias voltage. The derived bias voltage may be used to control other circuits (e.g., other amplifiers, oscillators, mixers, etc.) which require detection of RF presence.

18 Claims, 5 Drawing Sheets

MMIC BIAS APPARATUS AND METHOD

This application is a continuation of application Ser. No. 08/280,961, filed on Jul. 27, 1994, entitled "MMIC BIAS APPARATUS AND METHOD, now abandoned.

FIELD OF THE INVENTION

This invention relates in general to MMIC (microwave monolithic integrated circuit) bias apparatus and methods and in particular to derived negative voltage for single supply MMIC RF power amplifiers.

BACKGROUND OF THE INVENTION

RF power amplifiers are useful components in a large variety of radio frequency (RF) electronic applications. In particular, monolithic microwave integrated circuit (MMIC) field effect transistor (FET) power amplifiers are used in low cost, high volume consumer electronics. Many of these consumer electronics are portable, small, and require very small batteries. Given very limited battery life, MMIC circuits in such products require maximum power efficiency, using the smallest and least costly battery.

Conventional MMIC power amplifier circuits are biased by using one of two techniques: fixed bias from a separate bias battery placed in series with the FET gate; or self bias developed from a resistor placed in series with the FET source. Fixed bias operation requires two separate batteries—one battery supplies positive voltage between the drain and source of a FET power amplifier and a second battery provides negative bias potential applied between the gate and source of the same FET. Conventional self-bias MMIC RF power amplifier circuits using a resistor have limited power efficiency because significant power is wasted in the resistor which subtracts from the available MMIC drain to source supply voltage.

What is needed is a technique which improves MMIC FET power efficiency and also eliminates the need for a separate battery to supply negative bias. It would also be desirable to enhance efficiency by eliminating the resistor between common ground and the source of a FET RF power amplifier to obtain self bias. Such an apparatus and method would consume less battery power and substantially increase RF power amplifier efficiency. Also, given MMICs very small size, design freedom would be gained in terms of short circuit interconnections that do not have performance degrading parasitics.

DETAILED DESCRIPTION OF THE DRAWINGS

The method and apparatus described below take advantage of MMIC technology, resulting in devices with minimum circuit area, simplified circuitry, high efficiency and improved performance. Design flexibility allows common source or common gate configurations, offering the advantage of selecting high or low impedance matching techniques. The power amplifier uses active FETs, diodes, capacitors and resistors embodied within a MMIC substrate with physical dimensions of less than about 1.524 mm (0.060 inches) square. Overall power consumption is reduced (with reference to the self-bias case) because FET gate-to-source bias is self-generated into a high impedance bias load internally connected to a RF power amplifier gate circuit. The self-generated bias is proportionate to the amplitude of the applied RF drive and provides a form of class "C" performance for efficient large signal operating conditions. While the MMIC bias apparatus and method discussed is particularly suited for the application described below, other applications will be readily apparent to those of skill in the art.

Figure 1:
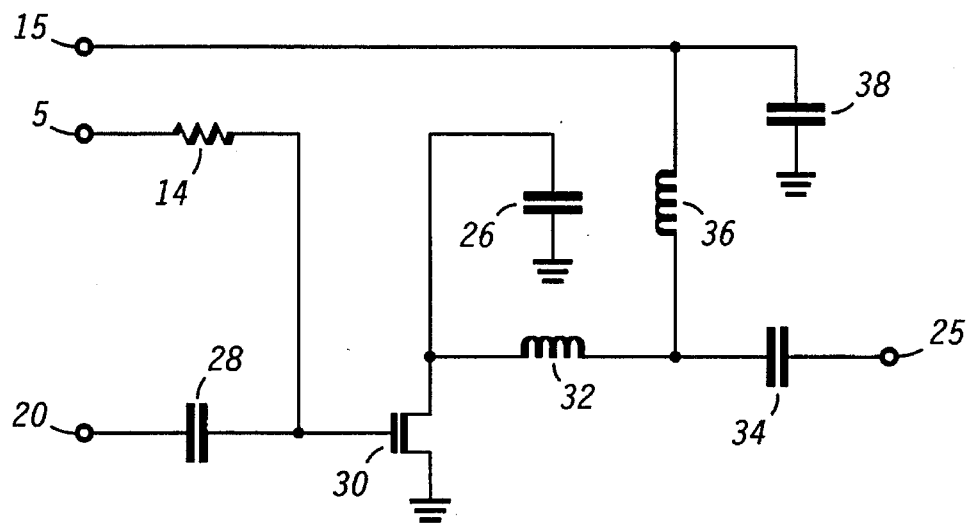
In FIG. 1, there is shown a circuit schematic of a fixed-biased MMIC FET RF power amplifier.

The present invention can be more fully understood with reference to the figures. FIG. 1 is a circuit schematic of a conventional, fixed-biased MMIC FET RF power amplifier 10. The conventional MMIC RF power amplifier 10 is comprised of inductors 32 and 36, capacitors 26, 28, 34, and 38, resistor 14, and a FET 30 interconnected between input ports 5, 15, 20 and output port 25. The basic RF power amplifier 10 of FIG. 1 is used as a reference to compare with the improved, more efficient performance that results from the application of the present invention.

An RF signal to be amplified is applied to port 20. A coupling capacitor 28 is connected between port 20 and the junction of isolation resistor 14 and the gate of FET 30. The other end of resistor 14 is attached to port 5 where a separate battery with negative potential (with respect to ground) provides gate bias to FET 30. The source of FET 30 is connected to common ground. The drain of FET 30 is connected to tuning inductor 32 and capacitor 26. The other end of capacitor 26 is connected to common ground. The other end of inductor 32 is connected to both tuning inductor 36 and coupling capacitor 34. The other end of inductor 36 is attached to bypass capacitor 38 and port 15. The other end of capacitor 38 is connected to common ground. Port 15 is attached externally to a positive voltage source of 3 to 5 VDC (with respect to ground) so that FET 30 is operative as an amplifier. The other end of capacitor 34 is attached to port 25, where amplified RF output is available. Capacitor 26 resonates with inductors 32 and 36 at the desired operating frequency. By attaching coupling capacitor 34 at the junction of inductors 32 and 36, impedance matching between FET 30 and a 50 ohm resistive load (not shown) attached to port 25 is accomplished.

Figure 2:
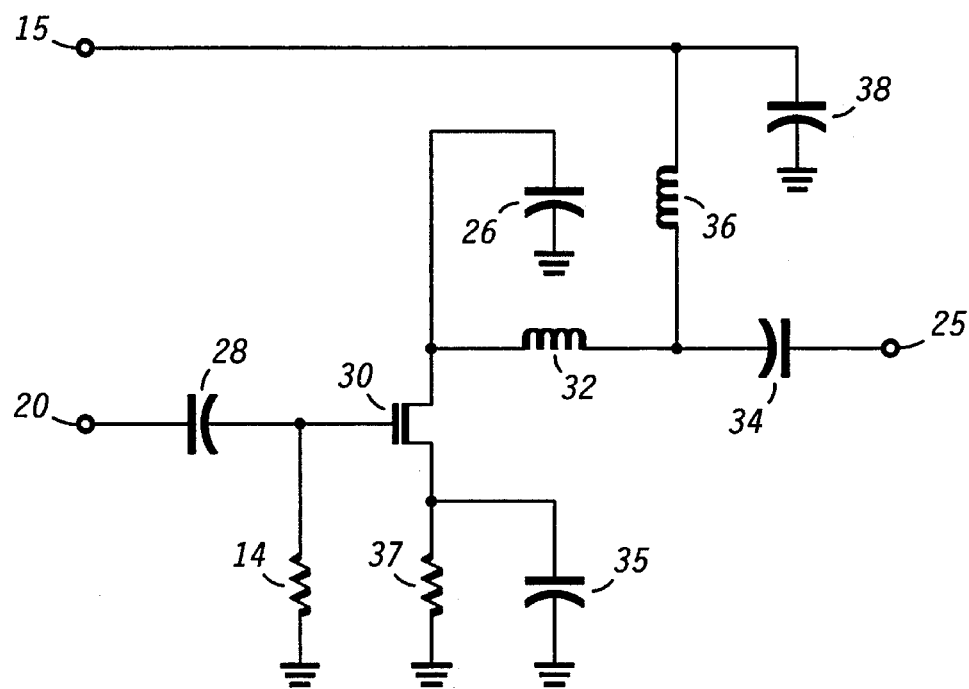
In FIG. 2, there is shown a circuit schematic of a self-generated biased MMIC FET RF power amplifier.

Another conventional MMIC RF power amplifier 10 schematic is shown in FIG. 2. Power amplifier 10 is comprised of inductors 32 and 36, capacitors 26, 28, 34, 35, and 38, resistor 14, and FET 30 interconnected between input ports 15, 20 and output port 25. This circuit is very similar to the circuit depicted in FIG. 1 (with corresponding elements numbered alike), except isolation resistor 14, attached to capacitor 28 and the gate of FET 30, is returned to common ground in FIG. 2. The source of FET 30 is lifted from common ground and attached to bias resistor 37 and capacitor 35. The opposite ends of resistor 37 and bypass capacitor 35 are connected to common ground. Effective negative bias is accomplished as FET 30 current is drawn through resistor 37. Typically, the voltage developed across resistor 37 is one volt. When the FET drain supply voltage applied to port 15 is three volts, only two volts remain for use by FET 30 for amplification. Additionally, power is dissipated in resistor 37, which raises the MMIC chip temperature. The overall result is decreased amplifier gain and operating efficiency.

Figure 3:
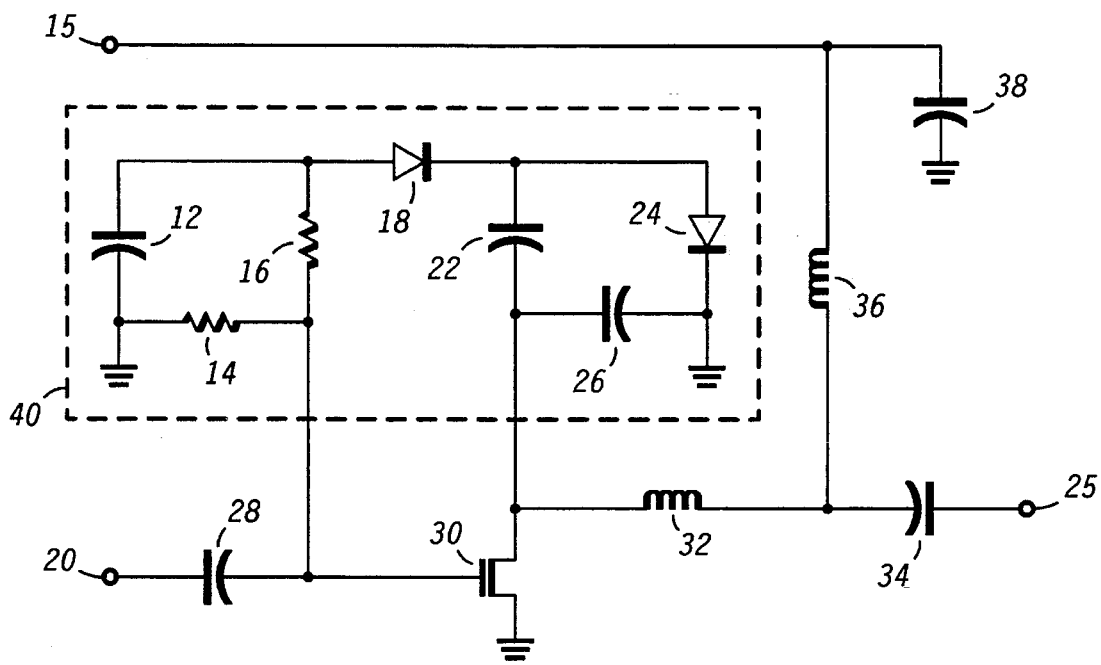
In FIG. 3, there is shown a circuit schematic of a RF-generated bias sub-network between the drain and gate of a FET configured as a common source amplifier, in accordance with a preferred embodiment of the invention.

FIG. 3 illustrates a new, efficient method of obtaining negative bias for a MMIC amplifier, oscillator or other monolithic efficient micro integrated circuit (MEMIC) in accordance with a preferred embodiment of the invention. In this illustration, an amplifier application is chosen as an example. A portion of the amplified RF signal is sampled, rectified and filtered, as described in detail below, to obtain a negative DC voltage for application to the gate of any MMIC FET. This technique is especially applicable to MMICs because the circuit elements are within close proximity of one another so that signal phase shift and distortion are minimized. This allows practical application of high impedance RF and DC feedback. The rectification process does not load the amplifier output significantly because the bias rectification circuit load is minimal when compared to the typical output signal load of 50 to 200 ohms. The overall result is efficient FET operation which takes full advantage of a typical 3.0 VDC drain to source supply for maximizing the a gallium arsenide (GaAs) FET's transconductance properties. This also allows maximum peak to peak output voltage swing at the FET drain, which drives the RF output load resistance.

The FIG. 3 MMIC RF-generated biased RF power amplifier incorporates a special sub-network 40. The circuit outside sub-network 40 is essentially identical to the schematic shown in FIG. 1 (with corresponding elements numbered alike). The performance is the same as the circuit of FIG. 1 when the gate bias potential is identical. Sub-network 40 is comprised of capacitors 12, 22, and 26, resistor 14, and diodes 18 and 24 interconnected between the gate and drain of FET 30.

An RF signal to be amplified is applied to port 20 in FIG. 3. A coupling capacitor 28 is connected between port 20 and the junction of isolation resistor 14 and the gate of FET amplifier 30. The other end of resistor 14 is attached to common ground. The source of FET 30 is connected to common ground. The drain of FET 30 is connected to tuning inductor 32 and capacitor 26. The other end of capacitor 26 is connected to common ground. The other end of inductor 32 is connected to tuning inductor 36 and coupling capacitor 34. The other end of inductor 36 is attached to bypass capacitor 38 and port 15. The other end of capacitor 38 is connected to common ground. Port 15 is attached externally to a positive voltage source of 3 to 5 VDC (with respect to ground) so that FET 30 is operative as an amplifier. The other end of capacitor 34 is attached to port 25, where amplified RF output is available. Capacitor 26 resonates with inductors 32 and 36 at the desired operating frequency. By attaching coupling capacitor 34 at the junction of inductors 32 and 36, impedance matching between FET 30 and a 50 ohm resistive load (not shown) attached to port 25 is accomplished.

Sub-network 40 in FIG. 3 includes a capacitor 26 (the same as capacitor 26 in the previous figures) connected to the drain of FET 30, inductor 32 and coupling capacitor 22. The other end of capacitor 26 is connected to common ground. The other end of capacitor 22 connects to the junction of RF rectifier diodes 18 and 24 which act as a rectifier on the RF signal. The other end of rectifier diode 24 is connected to common ground. The other end of rectifier diode 18 is connected to the junction of bypass capacitor 12 and voltage divider resistor 16. The other end of capacitor 12 is connected to common ground. The other end of resistor 16 is connected to bias level setting resistor 14, coupling capacitor 28, and the gate of FET 30 (i.e., the sub-network 40 output).

Sub-network 40 in FIG. 3 performs the task of sampling of the RF output wave form present at the drain of FET 30 (i.e., the sub-network 40 input) and polarity inverts the voltage thereat. DC charge is stored in capacitors 12 and 22 with negligible loading of tuned network of capacitor 26 and inductors 32 and 38. Resistors 14 and 16 are large enough to minimize DC discharge of capacitors 12 and 22. Resistors 14 and 16 are also proportioned to set ideal negative bias voltage to the gate of FET 30 without loading the RF input drive signal which is also applied to the gate of FET 30. In this circuit configuration, FET 30 provides high impedance broad-band loading for maximum amplitude high impedance RF coupling from the drain of an associate circuit providing a FET driver.

Figure 4:
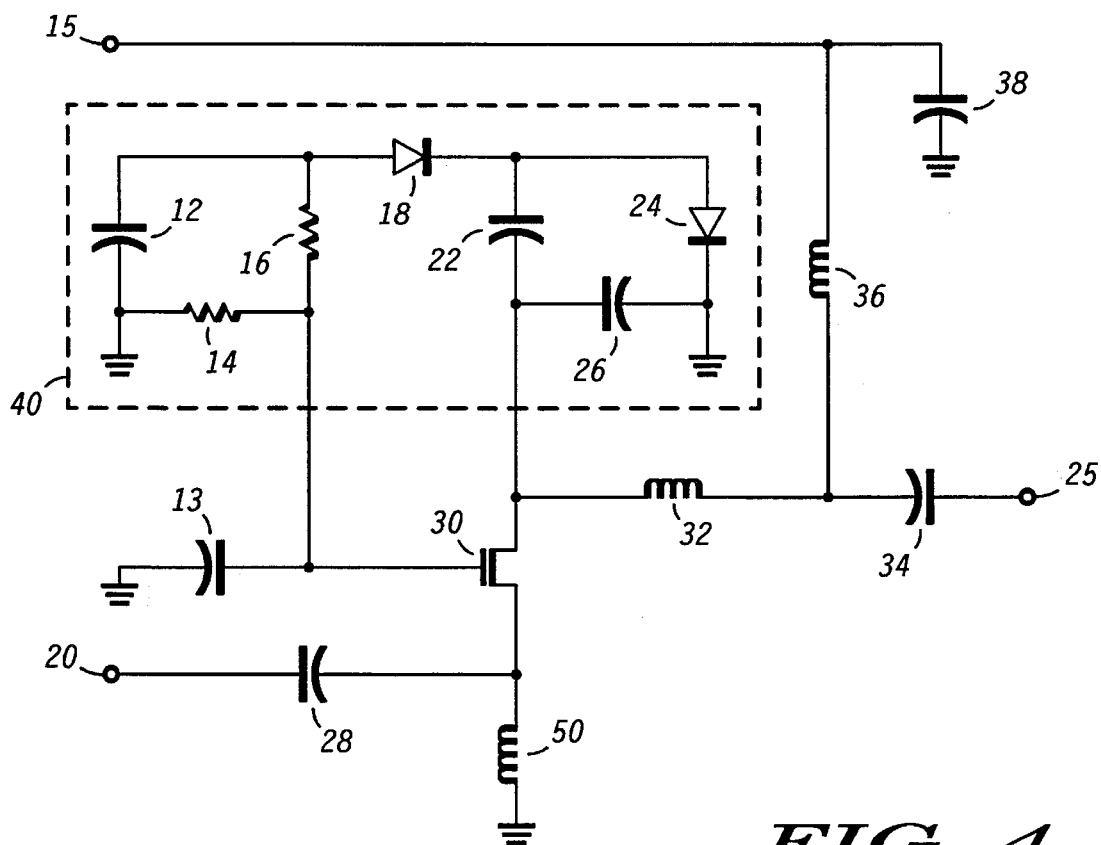
In FIG. 4, there is shown a circuit schematic of a RF-generated bias sub-network between the drain and gate of FET configured as a common gate amplifier, in accordance with a second preferred embodiment of the invention.

FIG. 4 depicts a MMIC RF amplifier configuration with the same RF-generated bias sub-circuit (sub-network 40) connected between the drain and gate of FET 30 (corresponding elements to FIG. 3 are numbered alike). Note, however, that bypass capacitor 13 is attached to the junction of resistor 14, resistor 16 and the gate of FET 30. The other end of capacitor 13 is connected to common ground. Capacitor 13 configures the amplifier for common gate operation. The RF input signal is coupled from port 20 into the source of FET 30. Instead of maximum amplitude coupling, low impedance coupling for transmission line matching is the objective. An RF signal to be amplified is applied to port 20. A coupling capacitor 28 is connected between port 20 and the junction of inductor 50 and the source of FET 30. The normal transfer characteristics of FET 30 provide a characteristic impedance level similar to typical 50 ohm transmission lines. Capacitor 28 and inductor 50 are designed for optimum impedance match and maximum amplifier gain at the desired operating frequency. Because there is minimum phase shift between the source and drain RF wave forms, signal distortion is minimized and very large peak to peak signals are realized for power amplifier applications. Sub-network 40 is used to set the bias operating point for maximum efficiency, approaching 90 percent, or maximum gain by adjusting the ratio of resistor 14 to resistor 16. Further adjustment of resistors 14 and 16 will provide enough negative bias at the gate of FET 30 to regulate RF output amplitude to a constant level for additional applications which require this particular feature.

Figure 5:
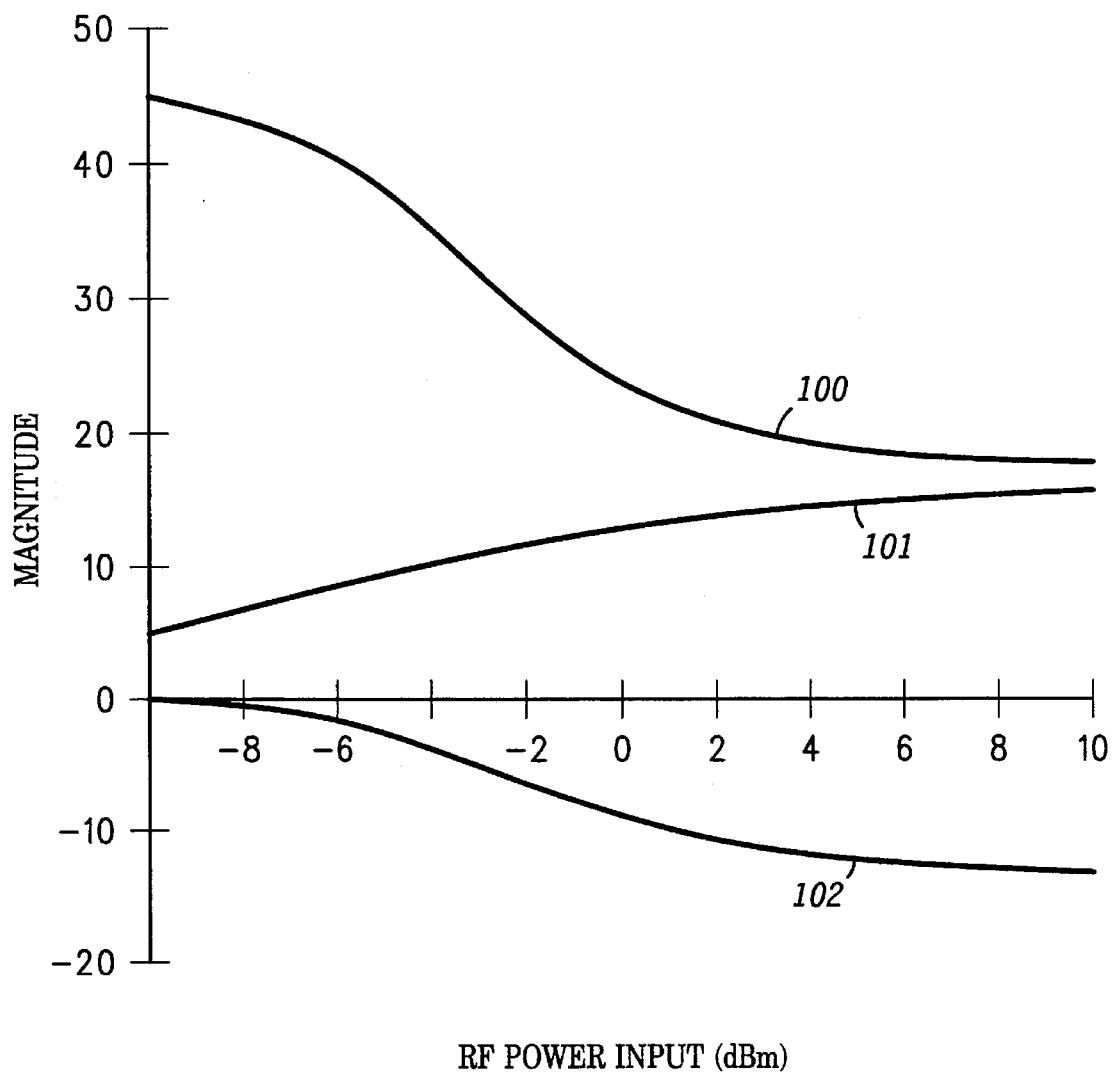
In FIG. 5, there is shown a graph of amplifier performance for a MMIC FET RF amplifier with RF-generated bias sub-network operation in accordance with FIGS. 3 and 4.

FIG. 5 illustrates the typical amplifier performance for a MMIC FET RF Amplifier with sub-network 40 (such as shown in FIG. 3 and FIG. 4) operational. For comparison purposes, the applied drain voltage for both circuits was set at 3.0 volts. The RF drive was varied between −10 dBm and +10 dBm and three output parameters were monitored: RF power output (line 101 in FIG. 5), gate bias voltage (×10, as shown by line 102) and drain current (line 100). With increased RF input drive, the RF power output (line 101) increases. The circuit has an initial gain of 15 dB and when fully driven, has a saturated gain of 6 dB. The drain current (line 100) decreases from a fixed level at low RF drive to 18 milliamperes (mA) at maximum RF drive. The self-generated gate bias voltage increases from zero to negative 1.3 volts at maximum RF drive. The RF to DC efficiency is maximum at maximum RF drive.

For comparison, peak to peak voltage wave forms of a conventional source resistor biased RF amplifier, such as depicted in FIG. 2 exhibit a drain peak to peak voltage swing between about 0.9 volts and 3.45 volts (2.55 volts peak to peak) with a gate voltage swing of 1.0 volt peak to peak, centered at 0.0 volts.

Figure 6:
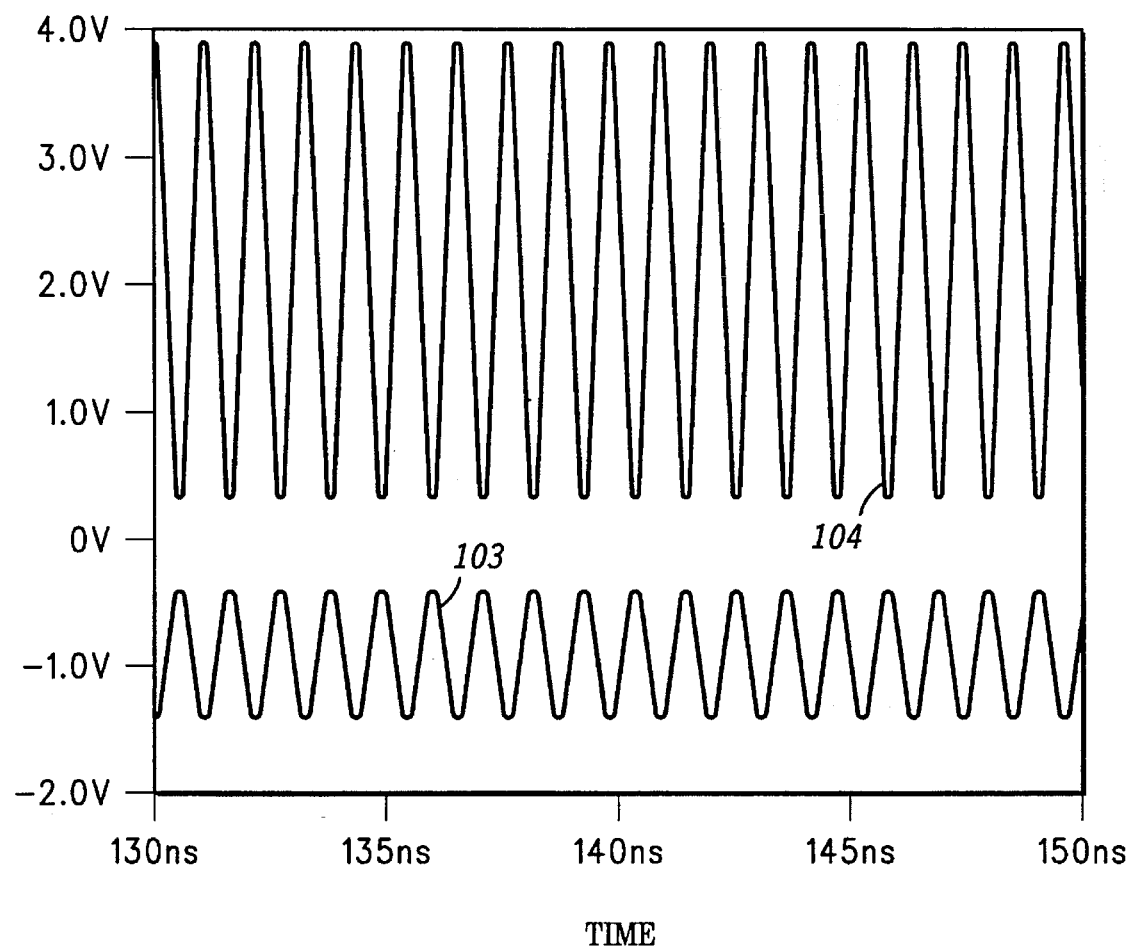
In FIG. 6, there is shown an example of output versus input wave forms produced in accordance with the method and apparatus of FIG. 3; and In FIG. 7, there is shown an example of output versus input wave forms produced in accordance with the method and apparatus of FIG. 4.

FIG. 6 illustrates peak to peak voltage wave forms of the RF amplifier depicted in FIG. 3. When the gate voltage swing (lower curve in FIG. 6) is 2.0 volt peak to peak, centered at −0.8 volt, the drain peak to peak voltage swing (upper curve) is between 0.4 and 3.9 volts (3.5 volts peak to peak). The advantage shown is increased voltage gain and increased dynamic range because the peak negative drain voltage wave form is farther from potential intercept with the gate peak positive wave form.

Figure 7:
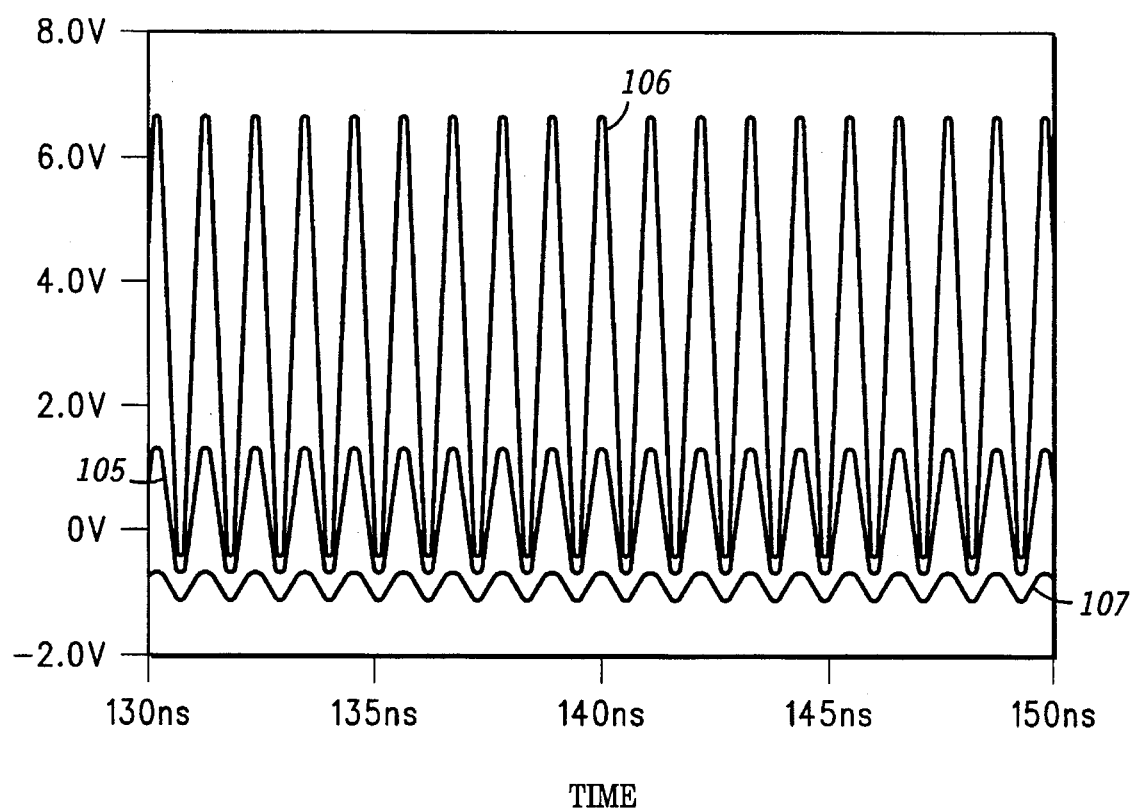

FIG. 7 illustrates peak to peak voltage wave forms of the RF amplifier depicted in FIG. 4. When the source voltage swing (middle curve in FIG. 7) is 2.0 volt peak to peak, centered at zero volts, the drain peak to peak voltage swing (upper curve) is between −0.4 and 6.9 volts (7.3 volts peak to peak). (The derived negative gate voltage is shown as the lowest curve in FIG. 7.) The advantage shown is increased voltage gain and increased dynamic range because the peak negative drain voltage wave form can not intercept the gate peak positive wave form.

Greater dynamic voltage range is illustrated for a common gate amplifier with derived negative bias applied to the gate. Because the source is driven, and the source and drain wave forms are in-phase, the drain wave form never intercepts the source wave form, reducing harmonic distortion. Because the drain voltage swings below zero volts, DC to RF efficiency is greatly enhanced.

Similar results can be shown for other MMIC FET circuits, including oscillators. By controlling the amount of detected negative DC voltage applied to the FET gate, and FET circuit connection (common source or common gate) the circuit can be optimized for any one of the following performance advantages: maximum RF output/DC input efficiency, maximum gain, maximum dynamic range, or automatic voltage/power leveling.

Thus, conventional MMIC circuits using GaAs FETs develop self-bias across a resistor inserted between the device source and common ground. The amount of self bias required is about one volt. The source resistor has the device's drain/source current (up to hundreds of milliamperes) flowing through it to develop one volt of bias. When the supply voltage is low (e.g., less than three volts for battery operation), less than two volts remain for amplification of signals. One third of the supply voltage times the device current is totally wasted.

When the supply voltage is two volts or less, the above described method and apparatus for biasing provide for greatly improved performance especially when the FET is connected in the common gate configuration. Very little power is used in developing bias for the amplifier and full drain to source supply voltage is still available to promote increased stage gain, higher operating efficiency, longer battery life and lower power consumption.

Efficiency is optimized with the MMIC bias apparatus and method because the generated bias voltage increases to the point where the amplifier output voltage begins to decrease, which in turn reduces the generation of bias voltage. Self-leveling of RF power output and maximum stage efficiency is attained by design selection and optimization of the self bias voltage divider component values. Moreover, elimination of power dissipation in the conventional source to ground bias resistor and optimization of MMIC amplifier efficiency reduces total chip heating. This allows more power handling capability for the same sized chip. In turn, fewer chips are required for a transmitter function.

In addition, smaller size products are possible with the MMIC bias apparatus and method described which eliminates the need for a separate bias battery in many applications. Batteries consume considerable space in modules which must be small (e.g. a wrist-watch size application).

Thus, there has also been provided a MMIC bias apparatus and method that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A microwave monolithic integrated circuit (MMIC) RF-generated bias circuit comprising:

an input for receiving an RF signal;

a rectifier for producing a rectified RF signal, the rectifier coupled to the input through a MMIC field effect transistor and to electrical ground;

a voltage divider for receiving the rectified RF signal and for producing a negative DC voltage in response thereto, the voltage divider coupled to the rectifier and to the electrical ground; and an output for applying the negative DC voltage to the MMIC field effect transistor (FET) for biasing, the output coupled to the voltage divider.

2. A MMIC RF-generated bias circuit as claimed in claim 1, further comprising a coupling capacitor coupled between the input and the FET.

3. A MMIC RF-generated bias circuit as claimed in claim 2, wherein the rectifier comprises:

a first capacitor having first and second terminals, the first terminal of the first capacitor coupled to the FET;

a first rectifier diode having an anode and a cathode, wherein the cathode of the first rectifier diode is coupled to the second terminal of the first capacitor and the anode of the first rectifier diode is coupled to the voltage divider;

a second rectifier diode have an anode and a cathode, wherein the cathode of the second rectifier diode is coupled to the electrical ground and the anode of the second rectifier diode is coupled to the second terminal of the first capacitor; and a second capacitor having first and second terminals, wherein the first terminal of the second capacitor is coupled to the anode of the first rectifier diode and the second terminal of the second capacitor is coupled to electrical ground.

4. A MMIC RF-generated bias circuit as claimed in claim 3, wherein the voltage divider comprises:

a first resistor coupled between the output and the anode of the first rectifier diode; and a second resistor coupled between the output and the electrical ground.

5. A method for biasing a microwave monolithic integrated circuit (MMIC) comprising the steps of:

sampling a RF signal to produce a signal sample;

rectifying the signal sample to produce a rectified signal;

filtering the rectified sample to produce a negative DC voltage; and applying the negative DC voltage to a MMIC field effect transistor (FET) for biasing.

6. A method for biasing a MMIC as claimed in claim 5, wherein the steps of sampling, rectifying, and filtering comprise the steps of sampling, rectifying, and filtering in a sub-network RF-generated bias circuit.

7. A method for biasing a MMIC as claimed in claim 5, wherein the step of applying the DC voltage comprises the step of applying the negative DC voltage to a gate of the MMIC FET.

8. A method for biasing a MMIC as claimed in claim 6, wherein the steps of sampling, rectifying, and filtering in a sub-network RF-generated bias circuit comprise the steps of sampling, rectifying, and filtering in a sub-network RF-generated bias circuit in an amplifier configured for common gate operation.

9. A method for biasing a MMIC as claimed in claim 7, wherein the step of sampling comprises the step of sampling the positive and negative peaks of a RF output waveform at a drain of the MMIC FET, reducing potential harmonic distortion resulting from non-symmetrical sampling.

10. A method for biasing a MMIC as claimed in claim 6, further comprising the step of tuning the sub-network RF-generated bias circuit.

11. An amplifier having a microwave monolithic integrated circuit (MMIC) RF-generated bias circuit wherein the amplifier comprises:

a MMIC field effect transistor (FET) having a drain and a gate, wherein the gate receives an RF signal applied at an input; and the MMIC RF-generated bias circuit including:

a rectifier for generating a negative DC voltage from the RF signal, the rectifier coupled to the drain and to electrical ground;

a voltage divider for dividing the negative DC voltage, the voltage divider coupled to the rectifier and to the electrical ground; and an output coupled to the voltage divider for applying the divided negative DC voltage to the MMIC field effect transistor (FET) for biasing, the output coupled to the voltage divider, wherein the output comprises a negative DC bias voltage.

12. An amplifier as claimed in claim 11, further comprising a coupling capacitor coupled between the input and the gate of the FET.

13. An amplifier as claimed in claim 12, wherein the rectifier comprises:

a first capacitor having first and second terminals, the first terminal of the first capacitor coupled to the drain of the FET;

a first rectifier diode having an anode and a cathode, wherein the cathode of the first rectifier diode is coupled to the second terminal of the first capacitor and the anode of the first rectifier diode is coupled to the voltage divider;

a second rectifier diode have an anode and a cathode, wherein the cathode of the second rectifier diode is coupled to the electrical ground and the anode of the second rectifier diode is coupled to the second terminal of the first capacitor; and a second capacitor having first and second terminals, wherein the first terminal of the second capacitor coupled to the anode of the first rectifier diode and the second terminal of the second capacitor coupled to the electrical ground.

14. An amplifier as claimed in claim 13, wherein the voltage divider comprises:

a first resistor coupled between the output and the anode of the first rectifier diode; and a second resistor coupled between the output and the electrical ground.

15. A bias circuit for generating a negative bias voltage at a gate of a transistor, the transistor having a drain and a source, the bias circuit comprising:

an input, coupled to the drain of the transistor, for receiving an RF signal;

a rectifier, coupled to the input, for producing a rectified RF signal;

a voltage divider, coupled to the rectifier, for receiving the rectified RF signal and for producing a negative DC voltage in response thereto; and an output, coupled to the voltage divider, for applying the negative DC voltage to the gate of the transistor thereby providing a negative bias voltage thereat.

16. A bias circuit as claimed in claim 15, further comprising a coupling capacitor coupled between the gate of the transistor and the applied RF signal.

17. A bias circuit as claimed in claim 15, wherein the rectifier comprises:

a first capacitor having first and second terminals, said first terminal of said first capacitor coupled to the drain of the transistor;

a first rectifier diode having an anode and a cathode, wherein the cathode of the first rectifier diode is coupled to the second terminal of the first capacitor and the anode of the first rectifier diode is coupled to the voltage divider;

a second rectifier diode having an anode and a cathode, wherein the cathode of the second rectifier diode is coupled to electrical ground and the anode of the second rectifier diode is coupled to the cathode of the first rectifier diode; and a second capacitor having first and second terminals, wherein said first terminal of said second capacitor is coupled to the anode of said first rectifier diode and said second terminal of said second capacitor is coupled to the electrical ground.

18. A bias circuit as claimed in claim 15, wherein the voltage divider comprises:

a first resistor coupled between the output and the anode of the first rectifier diode; and a second resistor coupled between the output and electrical ground.

* * * * *